US007838920B2

(12) United States Patent
Ghodsi

(10) Patent No.: US 7,838,920 B2
(45) Date of Patent: Nov. 23, 2010

(54) TRENCH MEMORY STRUCTURES AND OPERATION

(75) Inventor: Ramin Ghodsi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 902 days.

(21) Appl. No.: 11/633,211

(22) Filed: Dec. 4, 2006

(65) Prior Publication Data

US 2008/0130372 A1 Jun. 5, 2008

(51) Int. Cl.
*H01L 29/76* (2006.01)
*H01L 29/94* (2006.01)

(52) U.S. Cl. ............... 257/314; 257/315; 257/316; 257/317; 257/296; 257/330; 257/331; 458/259; 458/287; 365/185.28; 365/185.26

(58) Field of Classification Search ......... 257/314–317, 257/296, 330, 331; 365/185.28, 185.26; 438/259, 287
See application file for complete search history.

(56) References Cited

U.S. PATENT DOCUMENTS

| | | | |
|---|---|---|---|
| 6,465,844 B2 | 10/2002 | Saito et al. | |
| 6,878,988 B1 | 4/2005 | Lee et al. | |
| 6,977,412 B2 | 12/2005 | Smith | |
| 6,979,857 B2 | 12/2005 | Forbes | |
| 6,996,009 B2 | 2/2006 | Forbes | |
| 7,050,330 B2 | 5/2006 | Forbes | |
| 2004/0130934 A1 | 7/2004 | Prall et al. | |
| 2005/0029578 A1 | 2/2005 | Nishizaka | |
| 2005/0105341 A1 | 5/2005 | Forbes | |
| 2005/0236664 A1 | 10/2005 | Aoki et al. | |
| 2005/0253184 A1 | 11/2005 | Hung et al. | |
| 2006/0013042 A1 | 1/2006 | Forbes et al. | |
| 2006/0043411 A1 | 3/2006 | Bhattacharyya | |
| 2006/0163644 A1 | 7/2006 | Bhattacharyya | |
| 2006/0170038 A1* | 8/2006 | Wong et al. ............... 257/330 |
| 2006/0256617 A1 | 11/2006 | Yano et al. | |

* cited by examiner

*Primary Examiner*—Kenneth A Parker
*Assistant Examiner*—Joseph Nguyen
(74) *Attorney, Agent, or Firm*—Leffert Jay & Polglaze, P.A.

(57) ABSTRACT

Memory cells utilizing dielectric charge carrier trapping sites formed in trenches provide for non-volatile storage of data. The memory cells of the various embodiments have two control gates. One control gate is formed adjacent the trench containing the charge carrier trap. The other control gate has a portion formed over the trench, and, for certain embodiments, this control gate may extend into the trench. The charge carrier trapping sites may be discrete formations on a sidewall of a trench, a continuous layer extending from one sidewall to the other, or plugs extending between sidewalls.

32 Claims, 12 Drawing Sheets

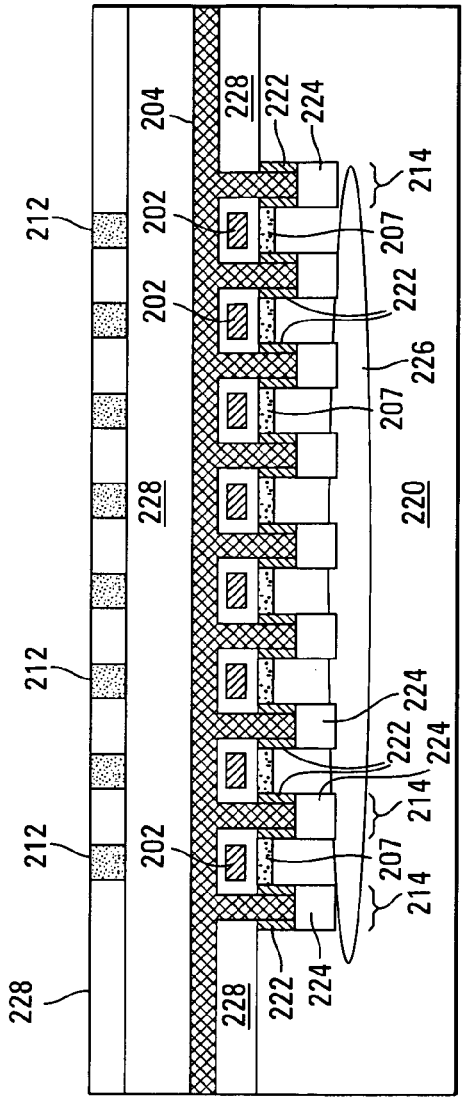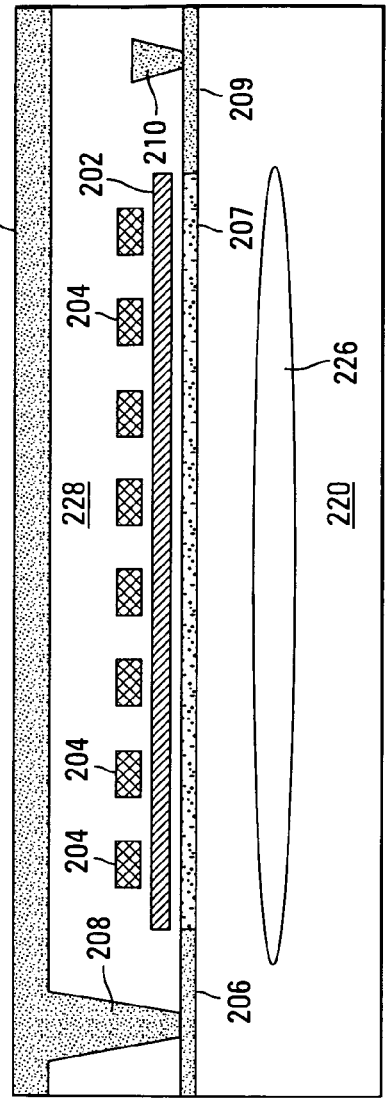
FIG. 3A
FIG. 3B

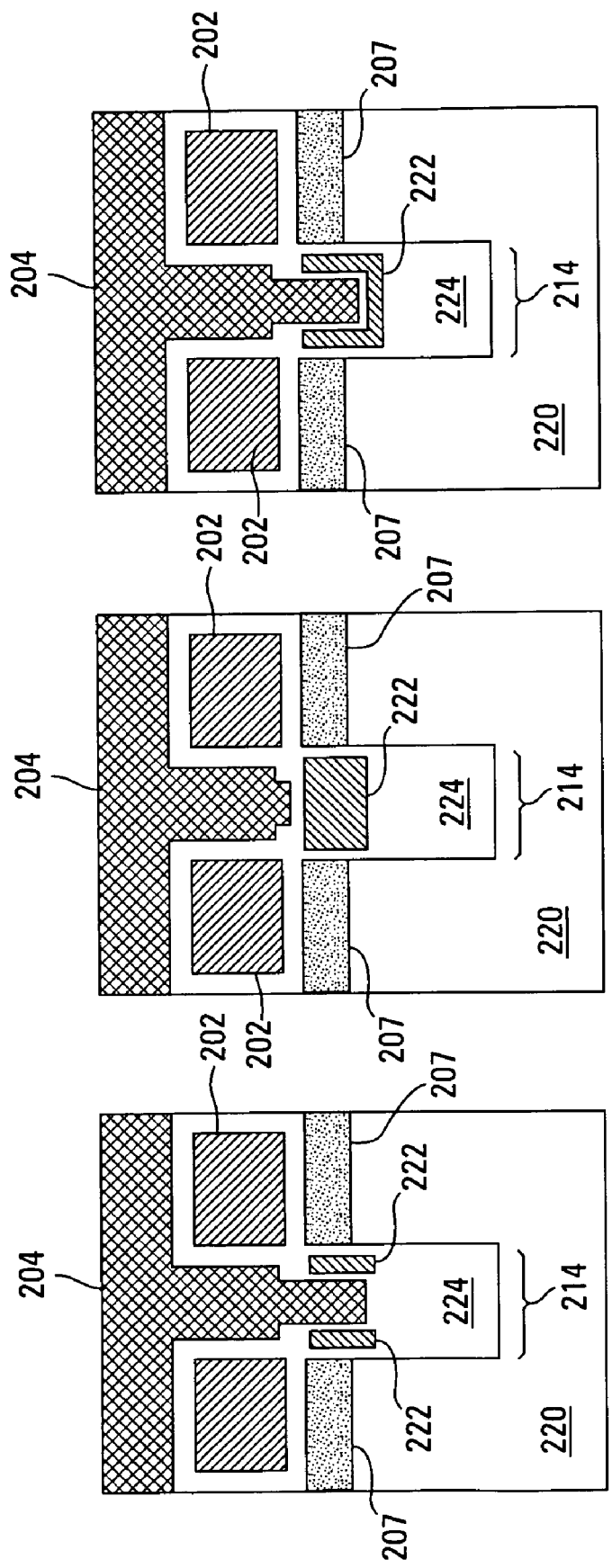

TRENCH MEMORY STRUCTURES AND OPERATION

TECHNICAL FIELD OF THE INVENTION

The present invention relates generally to semiconductor memory devices, and in particular, the present invention relates to non-volatile memory device architectures having charge-carrier trap sites in trenches.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As semiconductor memory devices continue to scale down to smaller and smaller architectures, problems arise. As just a few examples related to typical NAND floating-gate structures, charge retention become increasingly difficult as dielectric layers become thinner, coupling from neighboring floating gates increases as separation between floating gates is reduced and the likelihood of disturbing the charge of a floating gate during the programming or reading of a neighboring cell increases for similar reasons. Similar problems arise with structures that rely on charge trapping sites, such as SONOS or NROM memory cells. For example, charge retention becomes increasingly difficult as the volume of the carrier storage nodes decrease and programming and read disturbs increase. Other problems include the mere fabrication of structures for decreasing gate lengths. However, cells that rely on charge trapping sites do not exhibit interference among floating gates of neighboring cells.

For the reasons stated above, and for other reasons stated below which will become apparent to those skilled in the art upon reading and understanding the present specification, there is a need in the art for alternative memory structures and their operation.

BRIEF DESCRIPTION OF THE DRAWINGS

FIGS. 3A-3B are cross-sectional views of the memory array of FIG. 2 in accordance with an embodiment of the invention.

FIGS. 4A-4C are cross-sectional views of memory cells in accordance with embodiments of the invention.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

The memory devices of the various embodiments include memory cells utilizing dielectric charge carrier trapping sites formed in trenches. The memory cells of the various embodiments have two control gates. One control gate is formed adjacent to the trench containing the charge carrier trap. The other control gate has a portion formed over the trench, and, for certain embodiments, this control gate may extend into the trench. The charge carrier trapping sites may be discrete formations on a sidewall of a trench, a continuous layer extending from one sidewall to the other, or plugs extending between sidewalls. The two control gates of the various embodiments mitigate against disturb conditions during programming or reading the memory cells.

Figure 1:
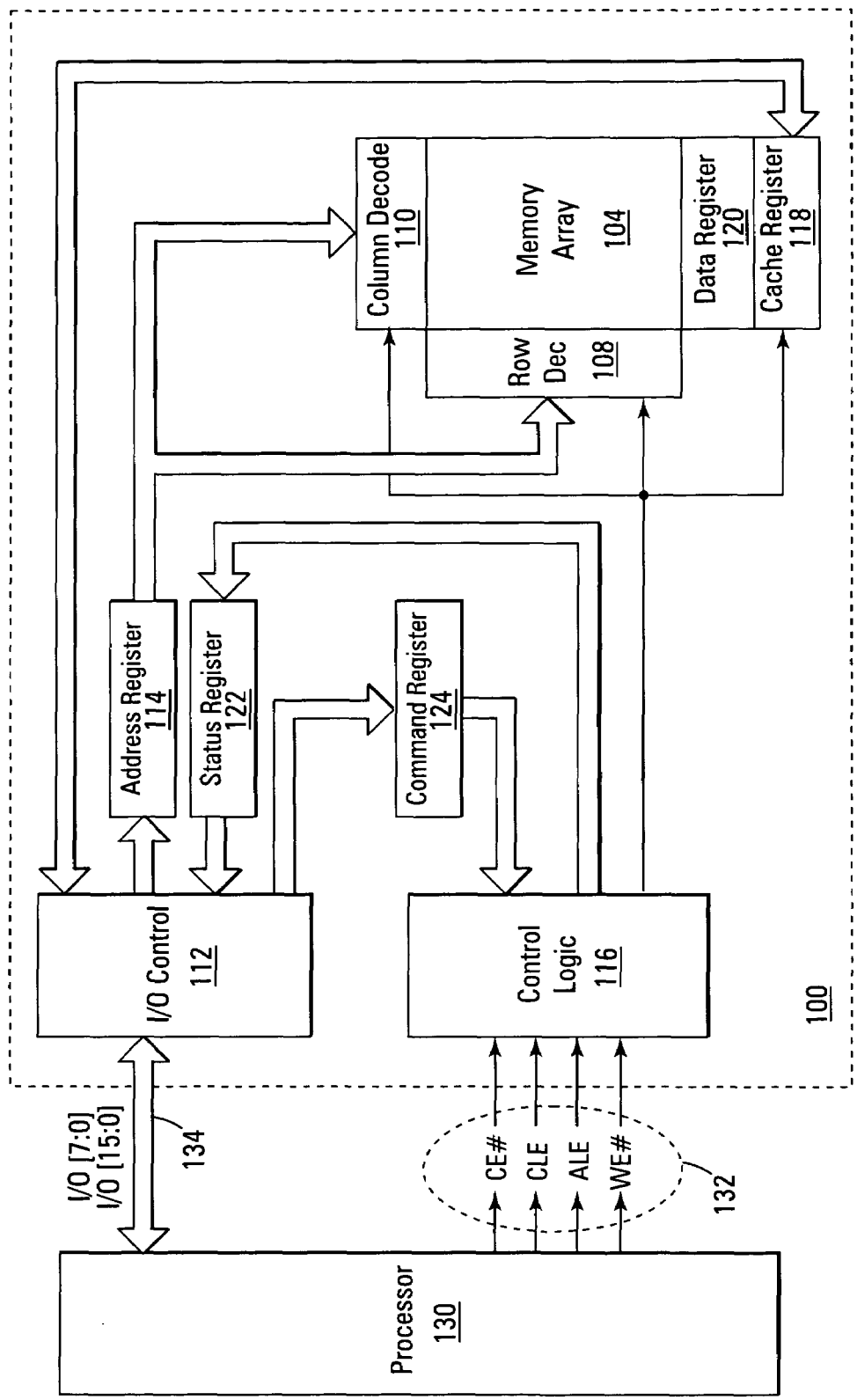
FIG. 1 is a functional block diagram of an electronic system having at least one memory device in accordance with an embodiment of the invention.

FIG. 1 is a simplified block diagram of a NAND flash memory device 100 coupled to a processor 130 as part of an electronic system, according to an embodiment of the invention. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external processor.

Memory device 100 includes an array of memory cells 104 arranged in rows and columns. The memory cells of the array 104 utilize dual control gate structures in accordance with embodiments of the invention. A row decode circuitry 108 and a column decode circuitry 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE# in accordance with the present invention. Memory device 100 receives command signals (or commands), address signals (or addresses), and data signals (or data) from processor 130 over a multiplexed input/output (I/O) bus 134 and outputs data to processor 130 over I/O bus 134.

Specifically, the commands are received over input/output (I/O) pins [0:7] of I/O bus 134 at I/O control circuitry 112 and are written into command register 124. The addresses are received over input/output (I/O) pins [0:7] of bus 134 at I/O control circuitry 112 and are written into address register 114. The data are received over input/output (I/O) pins [0:7] for an 8-bit device or input/output (I/O) pins [0:15] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [0:7] for an 8-bit device or input/output (I/O) pins [0:15] for a 16-bit device. It will be appreciated by those skilled in the art that additional circuitry and control signals can be provided, and that the memory device of FIG. 1 has been simplified to help focus on the invention. Additionally, while the memory device of FIG. 1 has been described in accordance with popular conventions for receipt and output of the various signals, it is noted that the various embodiments are not limited by the specific signals and I/O configurations described unless expressly noted herein.

Figure 2:
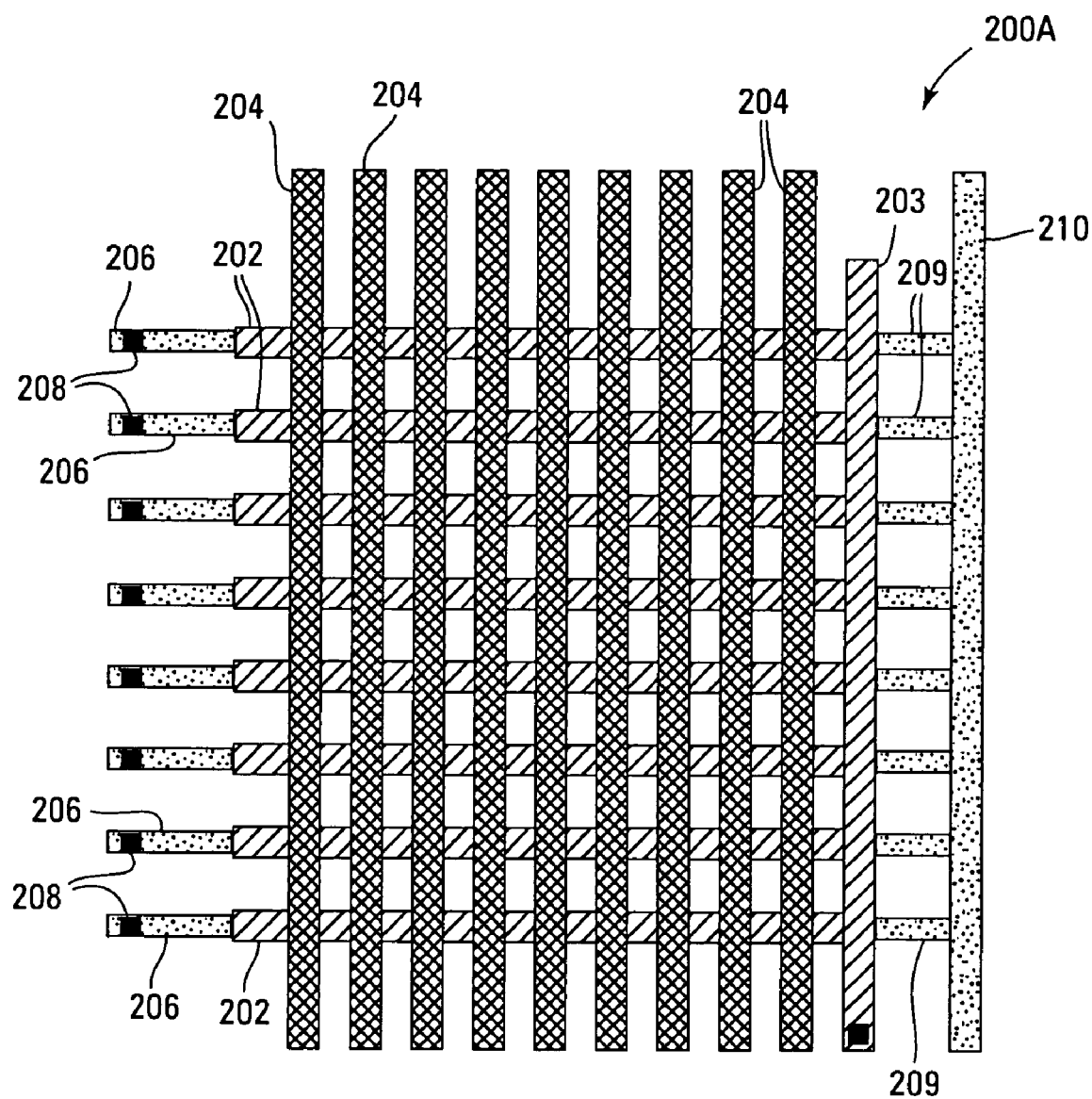
FIG. 2 is a top view of a portion of a memory array showing array architecture as might be used with an embodiment of the invention.

FIG. 2 is a top view of a portion of a memory array 200 showing array architecture as might be used with an embodiment of the invention. As shown in FIG. 2, the memory array 200 includes memory cells formed at the intersections of first control gates 202 and second control gates 204. The first control gates 202 are formed over active areas of a semiconductor substrate and may be termed active gates. Portions of the second control gates 204 are formed over isolation trenches of the semiconductor substrate and may be termed trench gates. For ease of addressing in the digital environment, the number of first control gates 202 and the number of second control gates 204 are generally each some power of two. The first control gates 202 may further be electrically coupled, such as by a first control gate select line 203. Although the memory array 200 depicts am 8×8 block of memory cells having eight first control gates 202 and eight second control gates 204, a block may contain more or less memory cells. As an example, a block might contain 32 second control gates 204 by 1,024 first control gates 202. However, the embodiments will be described with reference to a relatively small block of memory cells in order to show the components in more detail.

The first control gates 202 overlie diffusion areas 206, diffusion areas 209 and channel implant areas (not shown in FIG. 2). The diffusion areas 206 are conductively doped regions coupled to a bit line contact 208 on one end of the first control gates 202 and the diffusion areas 209 are conductively doped regions coupled to a ground node, such as a source line 210, on the other end of the first control gates 202.

FIGS. 3A-3B are cross-sectional views of the memory array 200 in accordance with an embodiment of the invention. FIG. 3A is a cross-sectional view of the memory array 200 taken along a second control gate 204 while FIG. 3B is a cross-sectional view of the memory array 200 taken along a first control gate 202. Direction of current flow during a read operation is into the page for FIG. 3A and parallel to the page for FIG. 3B.

For the embodiment depicted in FIG. 3A, the second control gate 204 extends into isolation trenches 214 formed into a semiconductor substrate 220. Semiconductor substrate 220 may be, for example, a p-type monocrystalline silicon substrate. The isolation trenches 214 are at least partially filled with a dielectric material 224. Dielectric material 224 may include a variety of dielectric materials, e.g., silicon dioxide, doped silicate glass or other dielectric material generally resistant to storing charge carriers.

Charge carrier trapping sites 222 are formed on sidewalls of the isolation trenches 214. Charge carrier trapping sites 222 are formed of a material capable of trapping charge carriers. One example includes silicon nitride, or composites such as ONO (oxide-nitride-oxide). However, smaller dimensions and ease of fabrication may be facilitated through the use of trapping materials having dielectric constants greater than that of silicon nitride, which has a dielectric constant, k, of about 3.9. Some examples of higher-k dielectrics include $HfO_2$, $ZrO_2$, ZrSnTiO, ZrON, ZrAlO, $ZrTiO_4$, $Al_2O_3$, $La_2O_3$, $LaAlO_3$, $HfAlO_3$, HfSiON, $Ta_2O_5$, $TiO_2$, $Pr_2O_3$, $HfO_2$, TiAlOx, $LaAlO_3$, $La_2Hf_2O_7$, and HfTaO. For some embodiments, the charge trapping materials have a dielectric constant of approximately 10 or higher.

To further aid in isolation of individual memory cells, a channel-stop implant 226 may be formed in the substrate 220 in contact with the dielectric material 224. The channel-stop 226 implant would have a conductivity type different than that of the substrate 220. For example, for a p-type substrate, the channel-stop implant 226 may be an n-type diffusion.

As shown in FIGS. 3A-3B, the memory array 200 would further include bit lines 212 extending substantially parallel with the first control gates 202 and coupled to a diffusion area 206 through a bit line contact 208. The various conductive components, e.g., first control gates 202, second control gates 204, bit line contacts 208 and source line 210 are isolated by one or more layers of dielectric material 228.

FIGS. 4A-4C are cross-sectional views showing more detail of the structure of memory cells in accordance with various embodiments of the invention. FIG. 4A corresponds to a memory cell having discrete charge carrier trapping sites 222 on either sidewall of the isolation trenches 214. FIG. 4B corresponds to a memory cell sharing a charge carrier trap 222 with an adjacent memory cell and extending between the sidewalls of the isolation trench 214. FIG. 4B corresponds to a memory cell sharing a charge carrier trap 222 with an adjacent memory cell and extending around a second control gate 204 from one sidewall of an isolation trench 214 to the other sidewall. Structures of the type depicted in FIGS. 4A-4C can be fabricated using techniques that are well understood in the art of semiconductor fabrication.

Figure 5A:
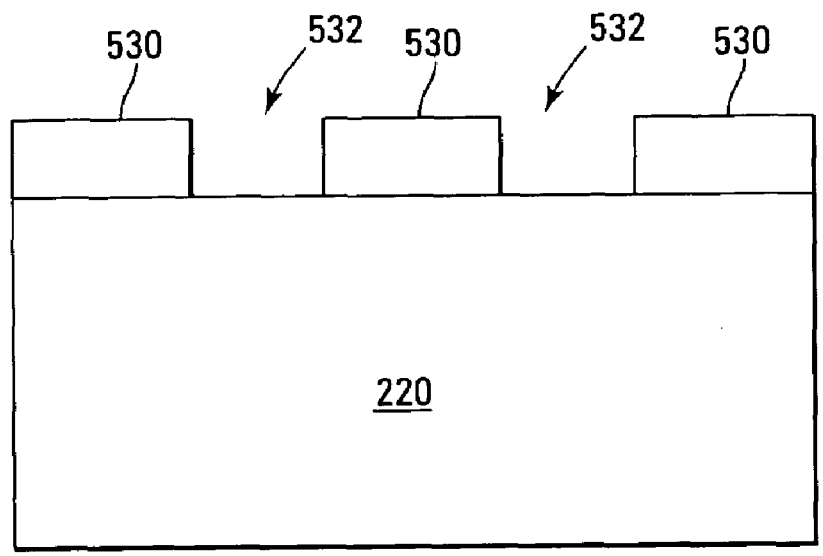
FIG. 5A-5J are cross-sectional views of a portion of a memory array at various stages of fabrication in accordance with an embodiment of the invention.
Figure 5B:
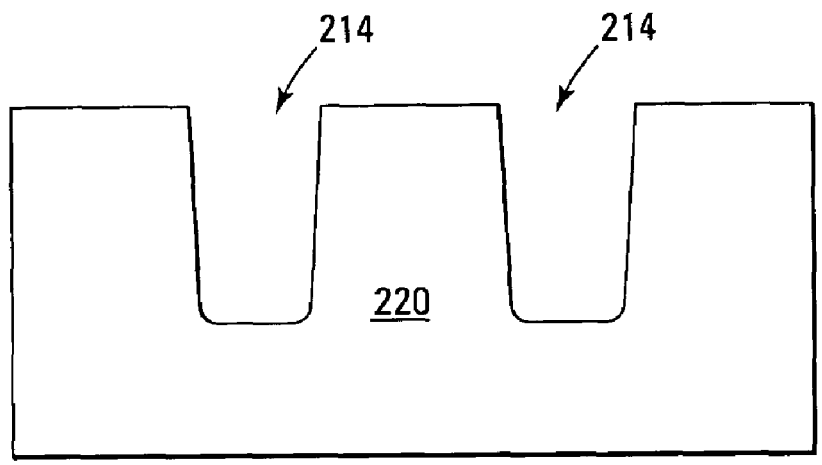
Figure 5C:
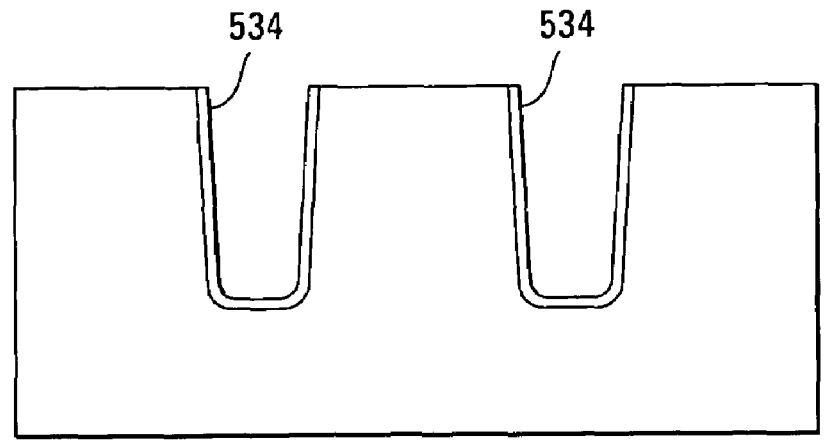

FIG. 5A-5J are cross-sectional views of a portion of a memory array at various stages of fabrication in accordance with an embodiment of the invention. In FIG. 5A, a mask 530 is formed overlying the substrate 220 to expose areas 532 for future isolation trenches. In FIG. 5B, portions of the substrate 220 defined by the exposed areas 532 are removed, such as by etching, to define isolation trenches 214. As depicted in FIG. 5C, a trench liner 534 may be formed on the sidewalls and bottoms of the trenches 214. For example, with a silicon-containing substrate 220, the trench liner 534 may be a thermally grown oxide. Alternatively, the trench liner 534 may be a deposited dielectric material. Liner material formed on an upper surface of the substrate 220 may be removed, such as by chemical-mechanical planarization (CMP). The trench liner 534, if utilized, may act as a tunnel dielectric to the subsequent charge carrier trapping sites.

Figure 5D:
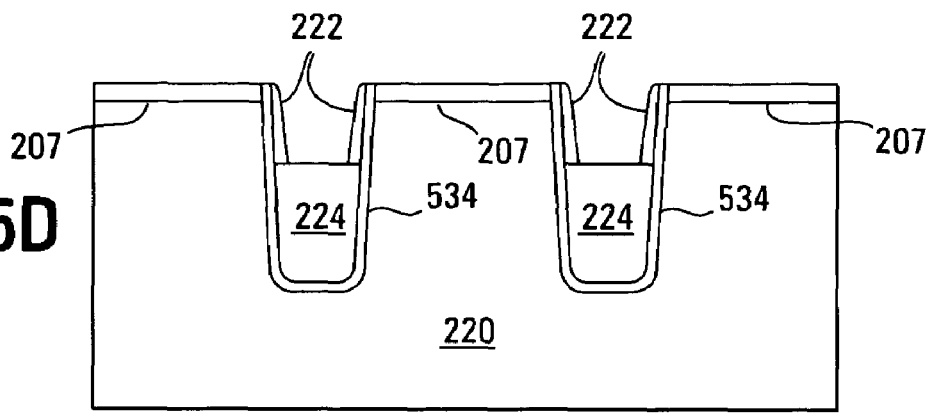

In FIG. 5D, a dielectric plug 224 is formed in the bottoms of the trenches 214 and the charge carrier trapping sites 222 are formed on sidewalls of the trenches 214. For example, the dielectric plugs 224 could be formed by forming a layer of dielectric material over the structure of FIG. 5C, followed by a removal of the dielectric material formed overlying the upper surface of the substrate 220, such as by CMP. This would leave the trenches 214 substantially filled with the dielectric material. This material could then be etched back to leave the dielectric plugs 224 in the trenches 214. To form the charge carrier trapping sites 222, a layer of charge trapping material could be formed overlying the upper surface of the substrate 220, the trench liners 534 and the dielectric plugs 224 followed by an anisotropic removal of the charge trapping material to leave behind the charge carrier trapping sites as depicted in FIG. 5D. At this stage, the channel implant areas 207 may be formed, such as by implanting and/or diffusing dopant materials to modify the conductivity of the substrate 220 in these areas to adjust for a desired threshold voltage Vt. Although the charge carrier trapping sites 222 are formed as discrete sites on the sidewalls of the trenches 214, alternatively the charge carrier trapping sites 222 could be formed as a continuous layer extending from one sidewall to the other such as that depicted in FIG. 4C. For example, instead of performing an anisotropic removal of the charge trapping material, a CMP process could be performed to remove only the charge trapping material on the upper surface of the substrate.

Figure 5E:
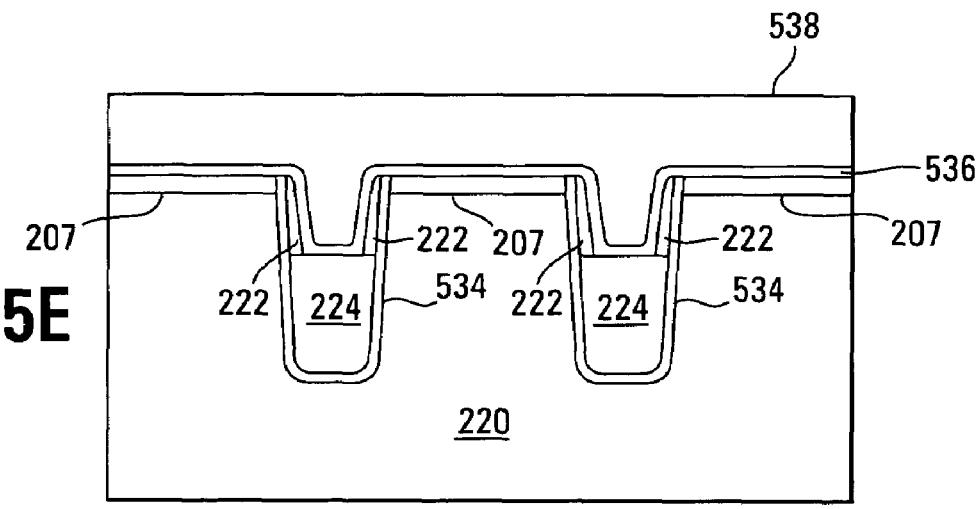

In FIG. 5E, a dielectric layer 536 may be formed overlying the structure of FIG. 5D to act as a blocking dielectric for the charge carrier trapping sites 222. Subsequent to forming the blocking dielectric layer 536, a conductive layer 538 is formed. Conductive layer 538 will form a portion of a second control gate. The conductive layer 538 may be formed of one or more layers of conductive material. Some examples include a conductively-doped polysilicon, a metal silicide, a metal or some combination of such conductive materials. Additional layers may include conductive adhesion or barrier layers.

Figure 5F:
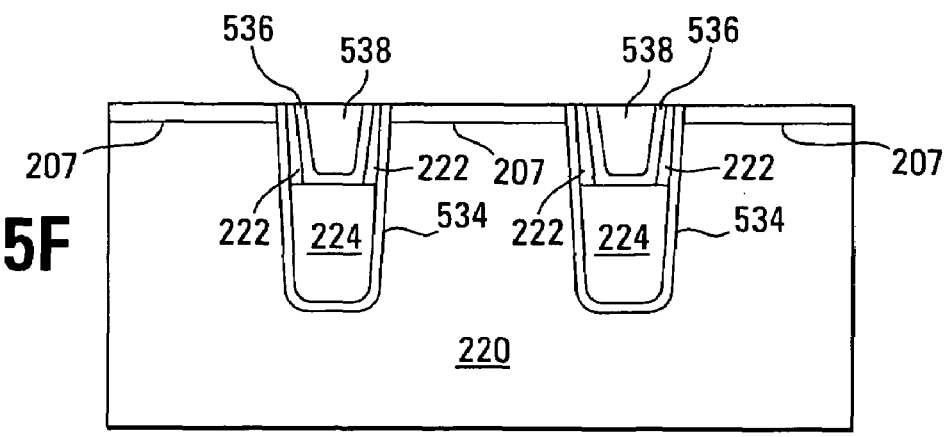

In FIG. 5F, portions of the conductive layer 538 are removed to leave conductive plugs 538 bounded by the blocking dielectric layer 536. Portions of the blocking dielectric layer 536 overlying the exposed portions of the substrate 220 may also be removed. For example, a CMP process could be utilized for form the structure of FIG. 5F. If channel implant areas 207 had not previously been formed, they may alternatively be formed at this point.

Figure 5G:
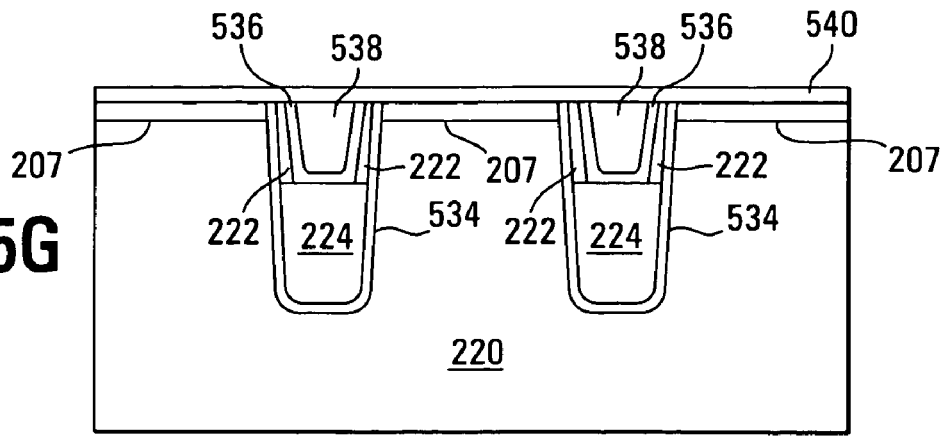
Figure 5H:
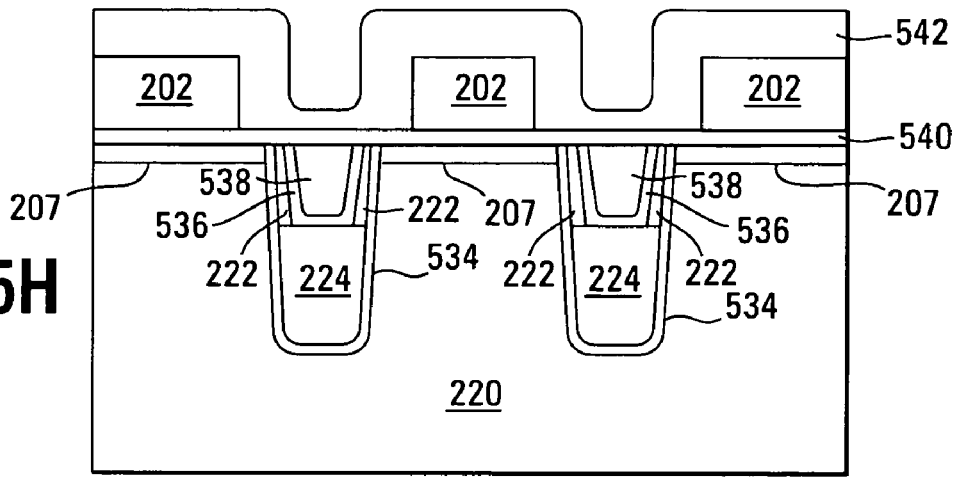
Figure 5I:
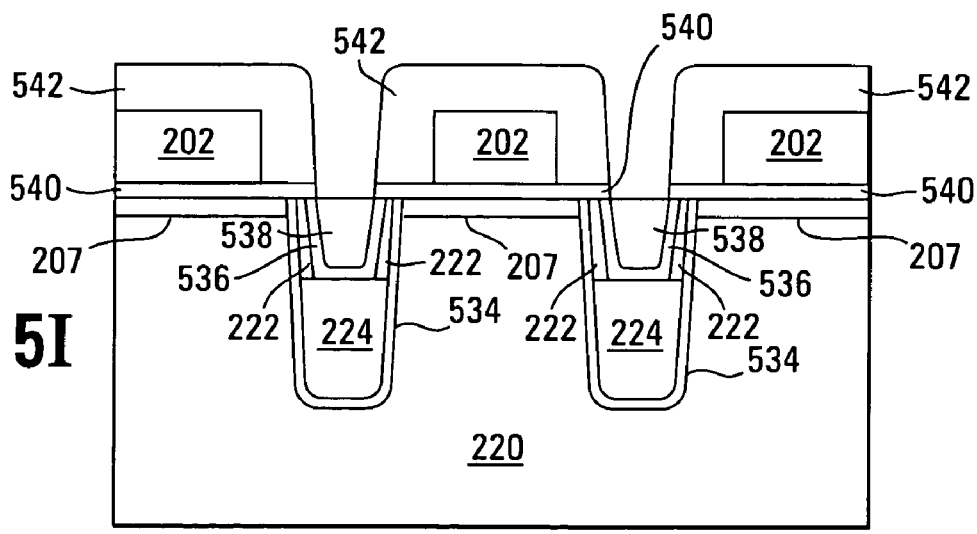

In FIG. 5G, a gate dielectric layer 540 is formed overlying the structure of FIG. 5F. Gate dielectric layer 540 may be a variety of dielectric materials, but typical construction may be a deposited silicon dioxide material. Following formation of this gate dielectric 540, the first control gates 202 may be formed as depicted in FIG. 5H. As an example, a conductive material may be formed overlying the dielectric layer 540 and then patterned to form the first control gates 202. The first control gates 202 may be formed of one or more layers of conductive material. Some examples include a conductively-doped polysilicon, a metal silicide, a metal or some combination of such conductive materials. Additional layers may include conductive adhesion or barrier layers.

As further shown in FIG. 5H, an intergate dielectric layer 542 is formed overlying the first control gates 202 to insulate the first control gates 202. Portions of the intergate dielectric layer 542 are then removed in FIG. 5I along with portions of the gate dielectric layer 540 to expose the conductive plugs 538. For example, the structure of FIG. 5H could be patterned and etched to remove portions of the intergate dielectric layer 542 and the gate dielectric layer 540 overlying the conductive plugs 538.

Figure 5J:
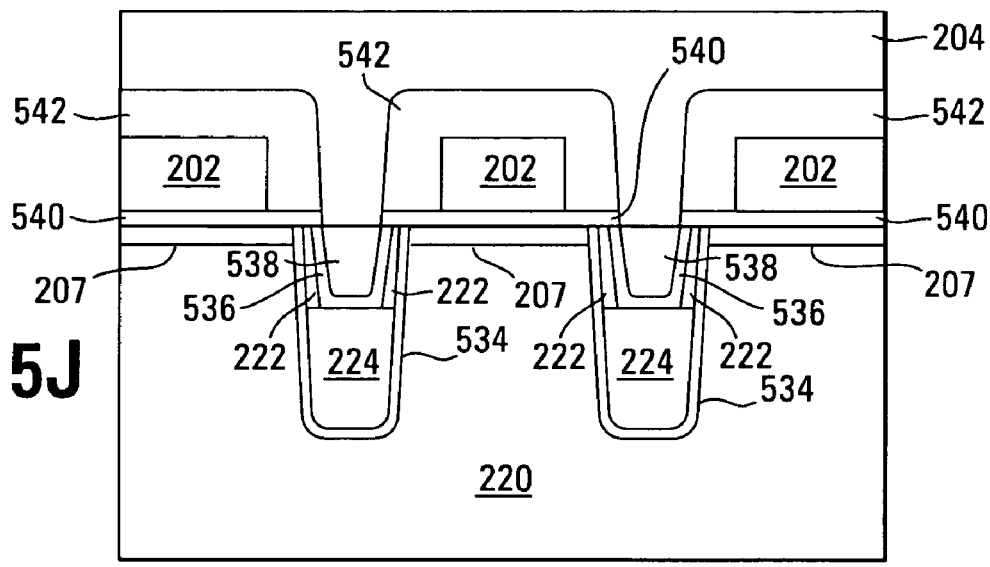

In FIG. 5J, the second control gate 204 is formed. Formation of the second control gates 204 can be substantially the same as formation of the first control gates 202. The thickness of the intergate dielectric layer 542 should be chosen to avoid breakdown between the first control gates 202 and the second control gates 204 during operation. As the second control gate 204 is in contact with the conductive plugs 538, the conductive plugs 538 may be deemed to be an extension of, or a portion of, the second control gate 204.

To form a structure similar to that depicted in FIG. 4B, the fabrication could generally follow the same process as described with reference to FIG. 5A-5J. However, instead of forming discrete charge carrier trapping sites 222 on opposing sidewalls of the trenches 214 as shown in FIG. 5D, a plug of charge trapping material could be formed overlying the dielectric plug 224. For example, a layer of charge trapping material could be formed overlying the upper surface of the substrate 220, the trench liners 534 and the dielectric plugs 224 to substantially fill the trenches 214. Charge trapping material overlying the upper surface of the substrate 220 could then be removed, such as by CMP, leaving behind a plug of charge trapping material in the trenches 214, similar to the structure of the charge carrier trap 222 as depicted in FIG. 4B. This plug could then optionally be recessed, such as by an etch process. Subsequent processing could then follow as described with reference to FIGS. 5G-5J with the exception that the conductive plugs 538 would not be present.

A memory cell is the structure at the intersection of a first control gate 202 and a second control gate 204. Charge stored in the charge carrier trapping sites 222 on opposing sides of the first control gates 202 define the data value of that memory cell. Because the charge carrier trapping sites 222 are dielectric, charge storage is localized. This allows a plug of charge trapping material as depicted in FIG. 4B to store charge for two different memory cells, i.e., the two memory cells on either side of the trench 214, if the dielectric constant of the material is sufficiently high to prevent migration of the charge. The charge stored in the charge carrier trapping sites 222 will tend to pinch off the channel in the adjacent channel implant area 207, thus changing the conductance of the channel implant area 207. A string of memory cells in accordance with an embodiment of the invention includes those memory cells associated with a single first control gate 202, e.g., those located between the source line 210 and the bit line contact 208.

Erasing memory cells of the type described with reference to FIGS. 2-5J can be performed by creating a sufficient voltage differential across the charge carrier trapping sites 222 to cause them to release their charge. In general, the first control gates 202 and second control gates 204 should receive some voltage sufficiently less than a voltage of the substrate 220 to cause the charge carriers, or electrons, to move from the charge carrier trapping sites 222 to the substrate 220. For example, the first control gates 202 and second control gates 204 could receive a negative erase voltage, e.g., −14V to −15V, while the substrate 220 receives the ground potential. Alternatively, the first control gates 202 and second control gates 204 could receive the ground potential while the substrate receives a positive erase voltage, e.g., +14V to +15V. Erasing would typically be performed on an entire block of memory cells before programming any memory cell of that block. Note that voltages described herein are examples only and will depend upon dimensions of the various layers. For example, erase voltages having a magnitude of approximately 14-15V would generally be appropriate where the thickness of the tunneling dielectric is approximately 20-30 Å.

In general, to program memory cells of the type depicted in FIGS. 2-5J, voltages are applied to the various nodes to invert the channel defined by the channel implant area 207 under the first control gates 202 and to initiate tunneling of charges, or electrons, from the substrate 220 into the charge carrier trapping sites 222. For example, the first control gates 202 could receive a first potential, such as a ground potential or 0V, or slightly higher, sufficient to invert the channels between the isolation trenches 214. A second control gate 204 associated with a target memory cell, or selected second control gate, could receive a second or program potential. The program potential applied to the second control gate 204 associated with a target memory cell should be sufficient to initiate tunneling. For example, the program potential could be 14-15V. Remaining second control gates 204, or unselected second control gates, should receive a third potential. This third potential should be chosen to avoid breakdown between selected and unselected trench gates. For example, this third potential may be some fraction of the program potential or may be the ground potential. Bit lines 212 and source lines 210 associated with target memory cells may receive the ground potential. Unselected bit lines 212 and source lines 210 not associated with at least one target memory cell may be allowed to float or may receive some other potential as applied to the first control gates 202 such that tunneling is inhibited on unselected memory cells.

To read memory cells of the type depicted in FIGS. 2-5J, voltages are applied to the first control gates 202 and second control gates 204 of a block of memory cells such that more current will flow between a bit line 212 and the source line 210 if a target memory cell has a first data value than will flow if the target memory cell has a second data value. As one example, each of the first control gates 202 could receive a first potential, such as the ground potential or some small positive potential, depending upon the threshold voltage of the cells. A second control gate 204 associated with a target memory cell, or selected second control gate, could receive a second or read potential. The read potential applied to the second control gate 204 associated with a target memory cell should be insufficient to overcome the charge stored in the charge carrier trapping sites 222 if the target memory cell has the second data value. In this manner, the conductance of the cell will differ depending upon the amount of charge stored. For example, the second control gate 204 associated with a target memory cell might receive the ground potential. Remaining second control gates 204, or unselected second control gates, should receive a third or pass potential. The pass potential applied to second control gates 204 not associated with the target memory cell should be sufficient to overcome any charge stored in the charge carrier trapping sites 222 of unselected memory cells such that their channels are not pinched off regardless of their data values. For example, the unselected second control gates 204 may receive approximately 4-5V.

The resulting difference in conductance of a target memory cell depending upon its data value can then be read by sensing the conductance of the string of memory cells containing the target memory cell. As one example, the bit lines 212 could be precharged to some potential, such as the supply voltage Vcc, while the source line 210 could receive the ground potential. The foregoing potentials would then be applied to the first control gates 202, the selected second control gate 204 and the unselected control gates 204. Those bit lines 212 associated with a string of memory cells containing a target memory cell having the first data value will experience a larger drop in voltage than those bit lines 212 associated with a string of memory cells containing a target memory cell having the second data value. Thus, by sensing a voltage level of the bit lines 212 after some predetermined delay, the data values of the target memory cells can be determined.

Figure 6:
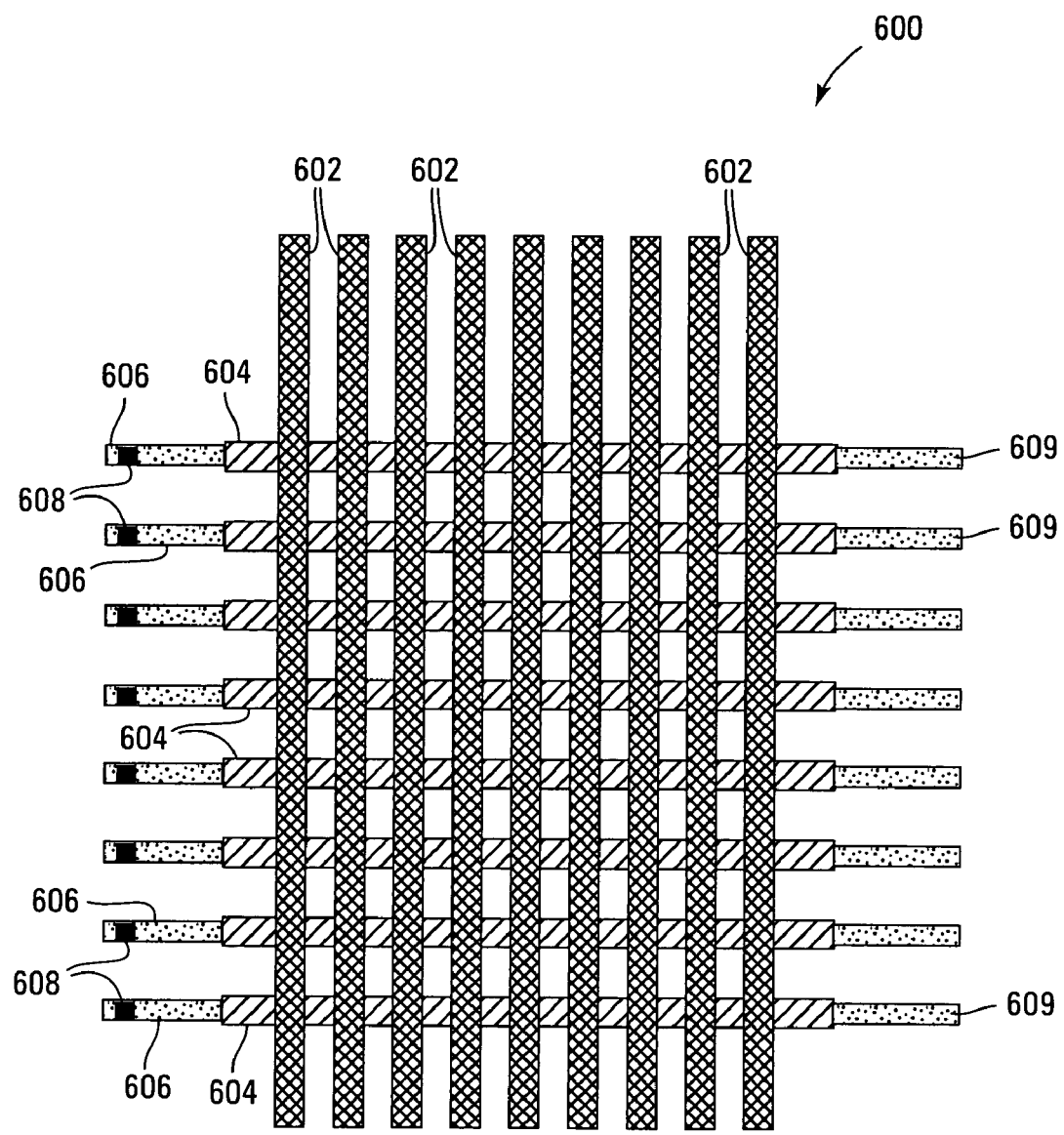
FIG. 6 is a top view of a portion of a memory array showing array architecture as might be used with another embodiment of the invention.

FIG. 6 is a top view of a portion of a memory array 600 showing array architecture as might be used with an embodiment of the invention. As shown in FIG. 6, the memory array 600 includes memory cells formed at the intersections of first control gates 602 and second control gates 604. The first control gates 602 are formed over active areas of a semiconductor substrate and may be termed active gates. Portions of the second control gates 604 are formed over trenches of the semiconductor substrate and may be termed trench gates. For ease of addressing in the digital environment, the number of first control gates 602 and the number of second control gates 604 are generally each some power of two. Although the memory array 600 depicts am 8×8 block of memory cells having eight first control gates 602 and eight second control gates 604, a block may contain more or less memory cells. As an example, a block might contain 32 first control gates 602 by 1,024 second control gates 604. However, the embodiments will be described with reference to a relatively small block of memory cells in order to show the components in more detail.

Diffusion areas 606 are coupled to a bit line contact 608 on one end of the second control gates 604. Diffusion areas 609 are coupled to act as source lines on the other end of the second control gates 604. Diffusion areas 609 may be coupled to a single ground node. However, for certain embodiments providing for multi-bit storage, these diffusion areas or source lines 609 may be individually addressable.

Figure 7A:
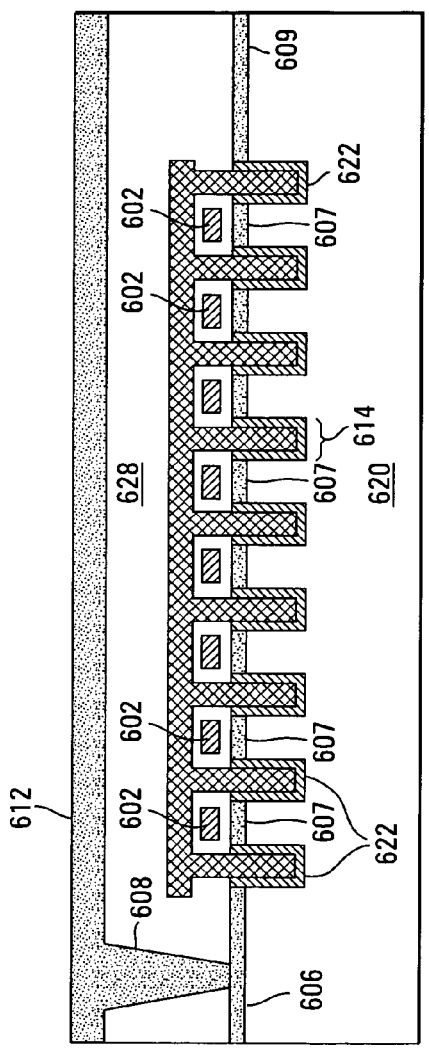
FIGS. 7A-7B are cross-sectional views of the memory array of FIG. 6 in accordance with an embodiment of the invention.
Figure 7B:
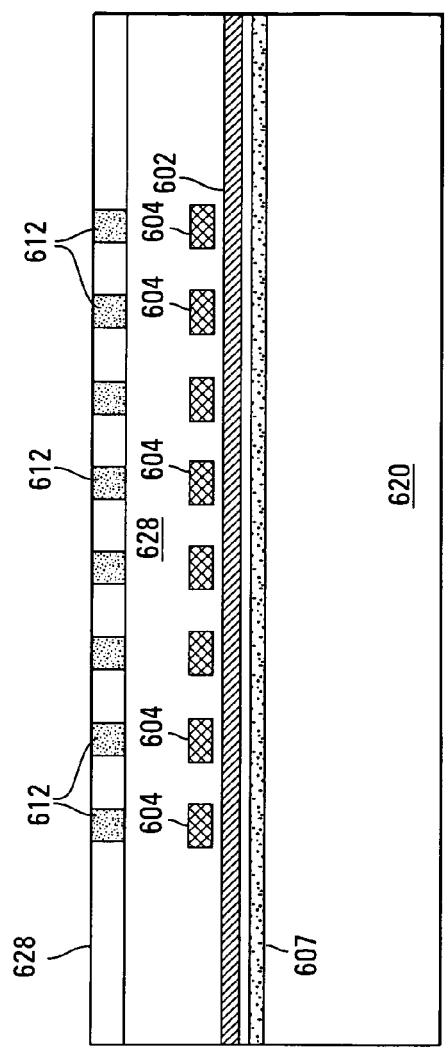

FIGS. 7A-7B are cross-sectional views of the memory array 600 in accordance with an embodiment of the invention. FIG. 7A is a cross-sectional view of the memory array 600 taken along a second control gate 604 while FIG. 7B is a cross-sectional view of the memory array 600 taken along a first control gate 602. Direction of current flow during a read operation is parallel to the page for FIG. 7A and into the page for FIG. 7B.

For the embodiment depicted in FIG. 7A, the second control gate 604 extends into trenches 614 formed into a semiconductor substrate 620. Semiconductor substrate 620 may be, for example, a p-type monocrystalline silicon substrate.

Charge carrier trapping sites 622 are formed on sidewalls and bottoms of the trenches 614. Charge carrier trapping sites 622 are formed of a material capable of trapping charge carriers. One example includes silicon nitride. However, smaller dimensions and ease of fabrication may be facilitated through the use of trapping materials having dielectric constants greater than that of silicon nitride, which has a dielectric constant, k, of about 3.9. Some examples of higher-k dielectrics include $HfO_2$, $ZrO_2$, $ZrSnTiO$, $ZrON$, $ZrAlO$, $ZrTiO_4$, $Al_2O_3$, $La_2O_3$, $LaAlO_3$, $HfAlO_3$, $HfSiON$, $Ta_2O_5$, $TiO_2$, $Pr_2O_3$, $HfO_2$, $TiAlOx$, $LaAlO_3$, $La_2Hf_2O_7$, and $HfTaO$. For some embodiments, the charge trapping materials have a dielectric constant of approximately 10 or higher.

As shown in FIGS. 7A-7B, the memory array 600 would further include bit lines 612 extending substantially parallel with the second control gates 602 and coupled to a diffusion areas 606 through a bit line contact 608. The various conductive components, e.g., first control gates 602, second control gates 604, bit line contacts 608 and source line 610 are isolated by one or more layers of dielectric material 628.

Figure 8:
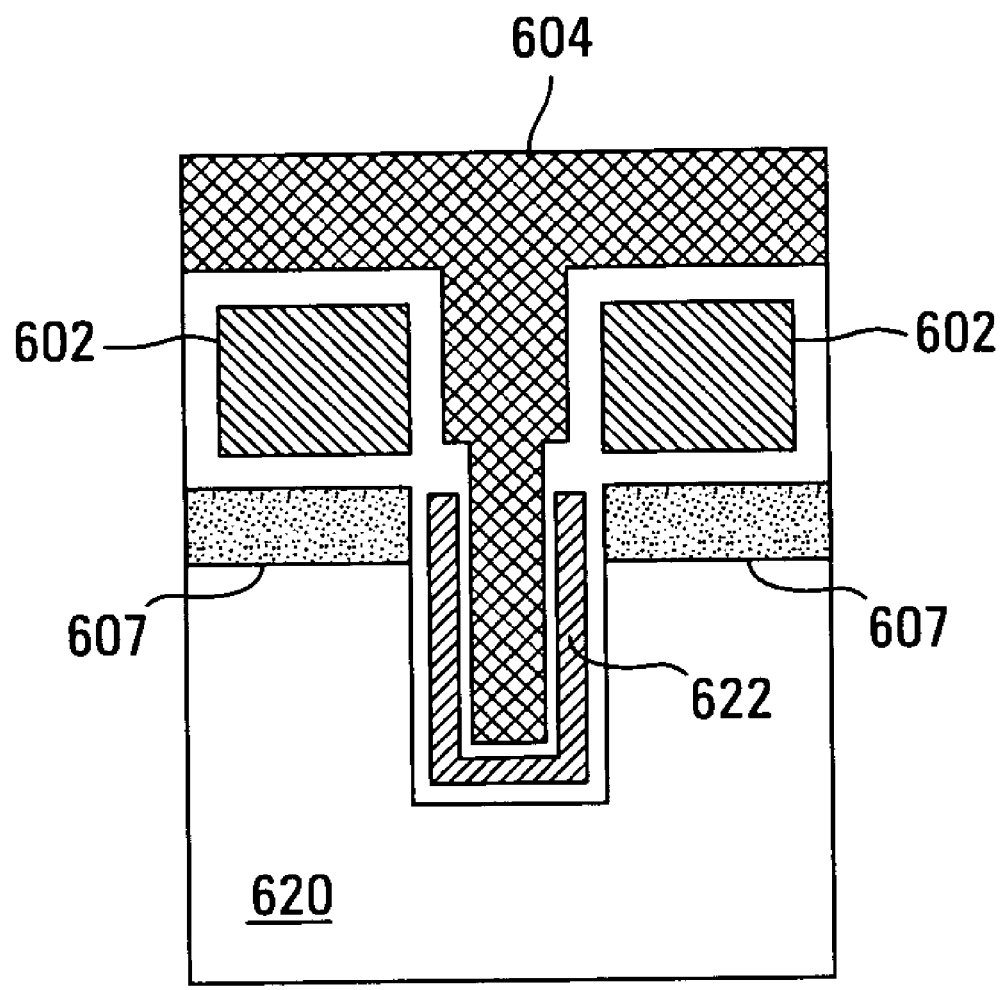
FIG. 8 is a cross-sectional view of a memory cell in accordance with an embodiment of the invention.

FIG. 8 is a cross-sectional view showing more detail of the structure of memory cells in accordance with various embodiments of the invention. Structures of the type depicted in FIG. 8 can be fabricated using techniques that are well understood in the art of semiconductor fabrication. For example, processing could be performed as described generally with reference to FIGS. 5A-5C. Then, instead of forming dielectric plugs 224, the charge carrier trap 622 could be formed in a manner similar to the trench liner 534, i.e., forming a layer of charge trapping material and removing portions overlying the upper surface of the substrate. Remaining processing could generally follow as provided with reference to FIGS. 5E-5J.

A memory cell is the structure at the intersection of a first control gate 602 and a second control gate 604. Charge stored in the charge carrier trapping sites 622 on opposing sides of the first control gates 602 define the data value of that memory cell. Because the charge carrier trapping sites 622 are dielectric, charge storage is localized. The charge stored in the charge carrier trapping sites 622 will tend to pinch off the channel in the adjacent channel implant area 607, thus changing the conductance of the channel implant area 607. A string of memory cells in accordance with an embodiment of the invention includes those memory cells associated with a single second control gate 604, e.g., those located between the source line 610 and the bit line contact 608.

Erasing memory cells of the type described with reference to FIGS. 6-9G can be performed by creating a sufficient voltage differential across the charge carrier trapping sites 622 to cause them to release their charge. In general, the first control gates 602 and second control gates 604 should receive some voltage sufficiently less than a voltage of the substrate 620 to cause the charge carriers, or electrons, to move from the charge carrier trapping sites 622 to the substrate 620. For example, the first control gates 602 and second control gates 604 could receive a negative erase voltage, e.g., −14V to −15V, while the substrate 620 receives the ground potential. Alternatively, the first control gates 602 and second control gates 604 could receive the ground potential while the substrate receives a positive erase voltage, e.g., +14V to +15V. Erasing would typically be performed on an entire block of memory cells before programming any memory cell of that block.

Programming of memory cells of the type depicted in FIGS. 6-9G can be performed, e.g., using tunneling between first and second control gates. However, because the charger carrier trapping sites 622 extend around the second control gates 604, such cells can also be programmed using gate induced drain leakage or GIDL. Programming using GIDL allows spatial storage of charge, thus facilitating storage of multiple data values in a single cell by programming and reading directionally.

For programming by tunneling, voltages are applied to the various nodes to initiate tunneling of charges, or electrons, from the first control gate 602 into the charge carrier trapping sites 622. For example, a first control gate 602 associated with a target memory cell, or selected first control gate, could receive a first potential, such as a ground potential or 0V. First control gates 602 not associated with a target memory cell, or unselected first control gates, could receive a second or inhibit potential. The inhibit potential applied to the unselected first control gates 602 should be sufficient to inhibit tunneling in unselected memory cells. For example, the inhibit potential could be approximately 10V. The second control gate 604 associated with a target memory cell should receive a third potential. This third potential should be high enough to initiate tunneling from the selected first control gate 602 into the trap sites. The second control gates 604 not associated with the target memory cell should receive a lower fourth potential of about half the level applied to the selected second control gate 604. Bit lines 612 and source lines 610 may be permitted to float.

For embodiments using GIDL, the memory cells are read and programmed in both a forwards and backwards direction of current flow in the source/drain regions (interchanging their source/drain function) to allow access to programming and reading the two stored data bits. The function of each source/drain region (i.e., whether source or drain) depends upon which bit trapping area is being read or written. For example, in a read operation, if the carrier is input at the left side source/drain region and output from the right side region, the left side is the source and the right side is the drain and the data bit charge is stored in the charge carrier trap 622 at the source end. Because of the localized storage of electrons in the trapping layer, while reading memory cells of such an embodiment, only the charge stored in the trapping layer nearest the source/drain region operating as the source affects the current flow through the device. The charge stored near the other source/drain region is "read through" and has minimal influence. The bits are programmed in the reverse bias/current flow direction from the read direction for each stored data bit.

For example, to program in a first direction from the bit line 212 to a target memory cell, the second control gates 604 receive a first potential sufficient to pass a program potential from the bit line 212 to the target memory cell. The program potential for the bit line 212 may be, for example, 6-7V. The source lines 609 may be allowed to float. The first potential applied to the second control gates 604 may be, for example, 9-10V. Each first control gate 602 between the bit line 212 and the target memory cell should also receive a potential sufficient to pass the program potential. These unselected first control gates 602 may receive the same potential as the second control gates 604. The first control gate 602 associated with the target memory cell would then receive a ground potential in order to cause band-to-band tunneling of charge in a portion of the charge carrier trap 622 adjacent the selected first control gate 602 and nearest the bit line 212. Upon programming in the first direction, the process could be repeated in the opposite direction, applying the program potential to the selected source line 609 and allowing its associated bit line 212 to float.

To read memory cells of the type depicted in FIGS. 6-9G, voltages are applied to the first control gates 602 and second control gates 604 of a block of memory cells such that more current will flow between a bit line 612 and the source line 609 if a target memory cell has a first data value than will flow if the target memory cell has a second data value. As one example, each of the second control gates 602 could receive a first or pass potential. For example, the pass potential may be 4-5V. A first control gate 602 associated with a target memory cell, or selected first control gate, could receive a second or read potential. The read potential applied to the first control gate 602 associated with a target memory cell should be insufficient to overcome the charge stored in the charge carrier trapping sites 622 if the target memory cell has the second data value. In this manner, the conductance of the cell will differ depending upon the amount of charge stored. For example, the first control gate 602 associated with a target memory cell might receive the ground potential or a potential between the pass potential and the ground potential. Remaining first control gates 602, or unselected first control gates, should receive the pass potential.

The resulting difference in conductance of a target memory cell depending upon its data value can then be read by sensing the conductance of the string of memory cells containing the target memory cell. As one example, one end of the string of memory cells, e.g., the bit lines 612, could be precharged to some potential, such as the supply voltage Vcc, while the other end of the string of memory cells, e.g., the source lines 609, could receive the ground potential. The foregoing potentials would then be applied to the selected first control gate 602, the unselected first control gates 602 and the second control gates 604. Those bit lines 612 (or source lines 609) associated with a string of memory cells containing a target memory cell having the first data value will experience a larger drop in voltage than those bit lines 612 (or source lines 609) associated with a string of memory cells containing a target memory cell having the second data value. Thus, by sensing a voltage level of the bit lines 612 (or source lines) after some predetermined delay, the data values of the target memory cells can be determined. In addition, because the charge carrier trap 622 extends from one first control gate 602 to the next, capacitive sensing can also be utilized.

Figure 9:
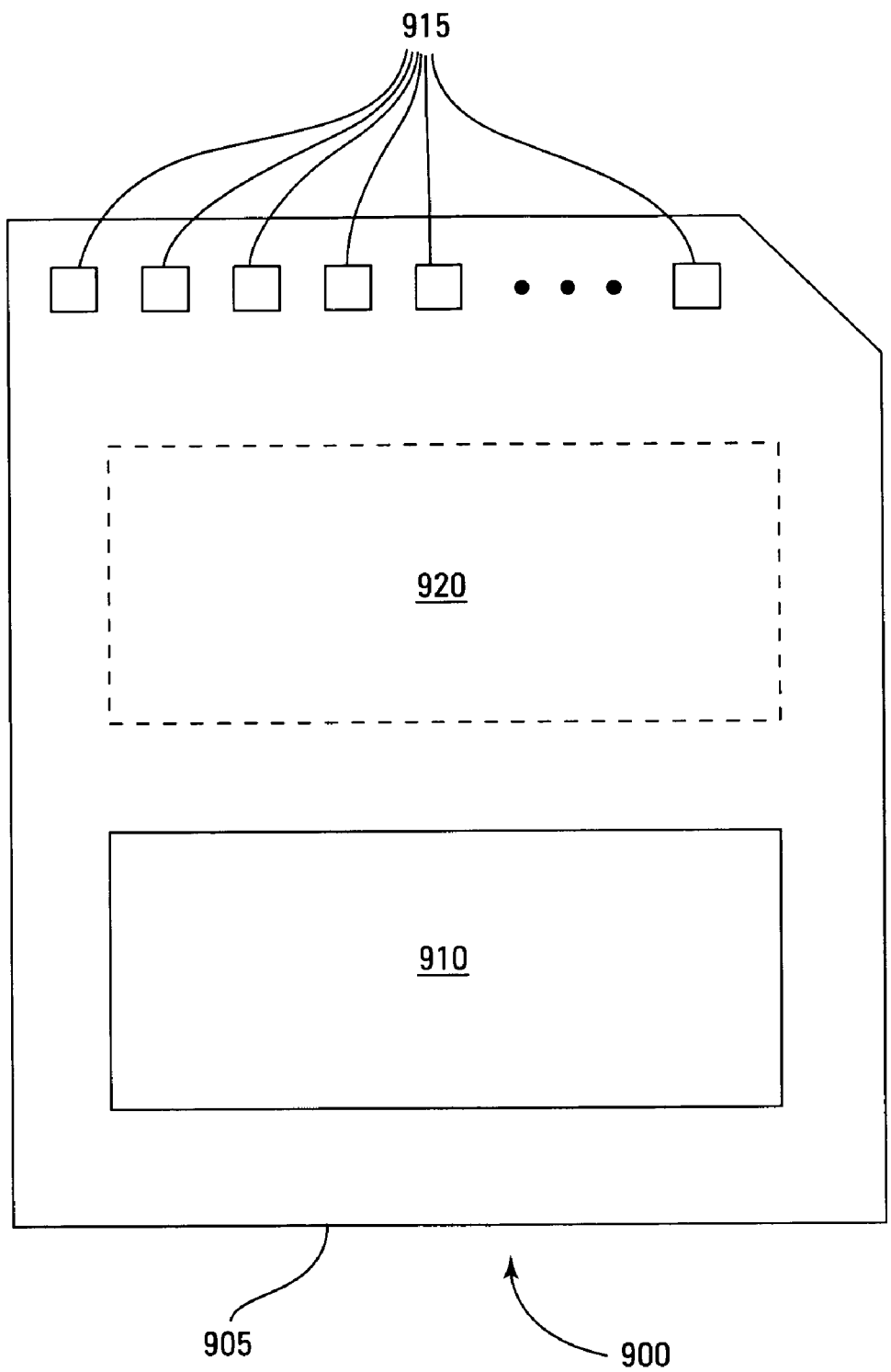
FIG. 9 is a functional block diagram of a memory module having at least one memory device in accordance with an embodiment of the invention.

FIG. 9 is an illustration of a memory module 900 in accordance with an embodiment of the invention. Memory module 900 is illustrated as a memory card, although the concepts discussed with reference to memory module 900 are applicable to other types of removable or portable memory, e.g., USB flash drives, and are intended to be within the scope of "memory module" as used herein. In addition, although one example form factor is depicted in FIG. 9, these concepts are applicable to other form factors as well.

In some embodiments, memory module 900 will include a housing 905 (as depicted) to enclose one or more memory devices 910, though such a housing is not essential to all devices or device applications. At least one memory device 910 is a non-volatile memory in accordance with an embodiment of the invention. Where present, the housing 905 includes one or more contacts 915 for communication with a host device. Examples of host devices include personal computers, PDAs, digital cameras, digital media players, digital recorders, games, appliances, vehicles, wireless devices, cellular telephones, memory card readers, interface hubs and the like. For some embodiments, the contacts 915 are in the form of a standardized interface. For example, with a USB flash drive, the contacts 915 might be in the form of a USB Type-A male connector. In general, contacts 915 provide an interface for passing control, address and/or data signals between the memory module 900 and a host having compatible receptors for the contacts 915.

The memory module 900 may optionally include additional circuitry 920 which may be one or more integrated circuits and/or discrete components. For some embodiments, the additional circuitry 920 may include a memory controller for controlling access across multiple memory devices 910 and/or for providing a translation layer between an external host and a memory device 910. For example, there may not be a one-to-one correspondence between the number of contacts 915 and a number of I/O connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910 such as logic functions as might be performed by an ASIC (application specific integrated circuit). Also, the additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

The various embodiments describe herein include memory cells utilizing dielectric charge carrier trapping sites formed in trenches. The memory cells of the various embodiments have two control gates. One control gate is formed adjacent the trench containing the charge carrier trap. The other control gate has a portion formed over the trench, and, for certain embodiments, this control gate may extend into the trench. The charge carrier trapping sites may be discrete formations on a sidewall of a trench, a continuous layer extending around the bottom of the trench from one sidewall to the other, or plugs extending between sidewalls.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory cell, comprising:
a first control gate overlying a semiconductor substrate;
a second control gate having a first portion overlying the first control gate, a second portion adjacent a first side of the first control gate and a third portion adjacent a second side of the first control gate;
a first charge carrier trapping site in the substrate and adjacent the first side of the first control gate;
a second charge carrier trapping site in the substrate and adjacent the second side of the first control gate;
a conductively doped portion of the substrate extending between the first and second charge carrier trapping sites; and
wherein an upper surface of the first control gate overlies an upper surface of the first charge carrier trapping site and an upper surface of the second charge carrier trapping site.

2. The memory cell of claim 1, wherein the second and third portions of the second control gate extend below a surface of the substrate.

3. The memory cell of claim 1, wherein the charge carrier trapping sites are formed in trenches in the substrate.

4. The memory cell of claim 3, wherein the charge carrier trapping sites extend only along a portion of one sidewall of their respective trenches.

5. The memory cell of claim 4, wherein the second and third portions of the second control gate extend to a level adjacent the charge carrier trapping sites.

6. The memory cell of claim 3, wherein the charge carrier trapping sites extend as a continuous layer from one sidewall of their respective trenches to the other sidewall of their respective trenches.

7. The memory cell of claim 3, wherein the charge carrier trapping sites extend across a bottom of their respective trenches from one sidewall to the other.

8. The memory cell of claim 3, wherein the charge carrier trapping sites extend between sidewalls of their respective trenches.

9. The memory cell of claim 8, wherein upper surfaces of the charge carrier trapping sites are recessed below an upper surface of the substrate.

10. The memory cell of claim 1, wherein the memory cell is adjacent a second memory cell sharing the same second control gate but a different first control gate.

11. A memory device, comprising:
a plurality of bit lines;
at least one source line;
a plurality of first control gates;
a plurality of second control gates intersecting with the first control gates;
a plurality of strings of memory cells coupled in series between a source line and a bit line, with each memory cell formed at an intersection of a first control gate and a second control gate; and
circuitry for control and access of the memory cells;
wherein the memory cells comprise charge trapping regions adjacent first and second sides of their respective first control gates; and
wherein an upper surface of each first control gate overlies an upper surface of the charge trapping region adjacent the first side of a respective first control gate and an upper surface of the charge trapping region adjacent the second side of the respective first control gate.

12. The memory device of claim 11, wherein the charge trapping regions are formed in trenches interposed between adjacent memory cells.

13. The memory device of claim 12, wherein the trenches are partially filled with a first dielectric material and the charge trapping regions comprise second dielectric material formed on sidewalls of the trenches above the first dielectric material.

14. The memory device of claim 13, wherein a portion of a second control gate is interposed between a charge trapping region on a first sidewall of a trench and a charge trapping region of the second sidewall of that trench.

15. The memory device of claim 13, wherein a charge trapping region on a first sidewall of a trench extends to the second sidewall of that trench.

16. The memory device of claim 12, wherein the charge trapping regions line sidewalls and bottoms of the trenches.

17. The memory device of claim 12, wherein the charge trapping regions extend as a continuous layer from one sidewall of their respective trenches to the other sidewall of their respective trenches.

18. A memory cell, comprising:
a first control gate overlying a semiconductor substrate;
a second control gate having a first portion overlying the first control gate, a second portion adjacent a first side of the first control gate and a third portion adjacent a second side of the first control gate;
a first charge carrier trapping site in the substrate and adjacent the first side of the first control gate;
a second charge carrier trapping site in the substrate and adjacent the second side of the first control gate; and
a conductively doped portion of the substrate extending between the first and second charge carrier trapping sites;
wherein the second portion of the second control gate is formed to overlie the first charge carrier trapping site;
wherein the third portion of the second control gate is formed to overlie the second charge carrier trapping site; and
wherein an upper surface of the first control gate overlies an upper surface of the first charge carrier trapping site and an upper surface of the second charge carrier trapping site.

19. The memory cell of claim 18, wherein the charge carrier trapping sites are formed in trenches in the substrate.

20. The memory cell of claim 19, wherein the charge carrier trapping sites extend between sidewalls of their respective trenches.

21. The memory cell of claim 20, wherein upper surfaces of the charge carrier trapping sites are recessed below an upper surface of the substrate.

22. The memory cell of claim 18, wherein the memory cell is adjacent a second memory cell sharing the same second control gate but a different first control gate, and sharing one of the charge trapping sites.

23. A memory cell, comprising:
   a first control gate overlying a semiconductor substrate;
   a second control gate having a first portion overlying the first control gate, a second portion adjacent a first side of the first control gate and a third portion adjacent a second side of the first control gate;
   a first charge carrier trapping site in the substrate and adjacent the first side of the first control gate;
   a second charge carrier trapping site in the substrate and adjacent the second side of the first control gate; and
   a conductively doped portion of the substrate extending between the first and second charge carrier trapping sites;
   wherein the second and third portions of the second control gate extend below a surface of the substrate;
   wherein the second portion of the second control gate is formed between portions of the first charge trapping site;
   wherein the third portion of the second control gate is formed between portions of the second charge trapping site; and
   wherein an upper surface of the first control gate overlies an upper surface of the first charge carrier trapping site and an upper surface of the second charge carrier trapping site.

24. The memory cell of claim 23, wherein the charge carrier trapping sites are formed in trenches in the substrate.

25. The memory cell of claim 24, wherein the first charge carrier trapping site extends as a continuous layer from one sidewall of its respective trench and across a bottom surface of the second portions of the second control gate to the other sidewall of its respective trench.

26. The memory cell of claim 25, wherein the first charge carrier trapping site further extends across a bottom of its respective trench from one sidewall to the other.

27. The memory cell of claim 23, wherein the memory cell is adjacent a second memory cell sharing the same second control gate but a different first control gate, and sharing one of the charge trapping sites.

28. A memory cell, comprising:
   a first control gate overlying a semiconductor substrate;
   a second control gate having a first portion overlying the first control gate, a second portion adjacent a first side of the first control gate and a third portion adjacent a second side of the first control gate;
   a first charge carrier trapping site in the substrate and adjacent the first side of the first control gate;
   a second charge carrier trapping site in the substrate and adjacent the second side of the first control gate; and
   a conductively doped portion of the substrate extending between the first and second charge carrier trapping sites;
   wherein the second and third portions of the second control gate extend below a surface of the substrate;
   wherein the first charge carrier trapping site is interposed between the second portion of the second control gate and the conductively doped portion of the substrate;
   wherein the second charge carrier trapping site is interposed between the third portion of the second control gate and the conductively doped portion of the substrate; and
   wherein an upper surface of the first control gate overlies an upper surface of the first charge carrier trapping site and an upper surface of the second charge carrier trapping site.

29. The memory cell of claim 28, wherein the charge carrier trapping sites are formed in trenches in the substrate.

30. The memory cell of claim 29, wherein the charge carrier trapping sites extend only along a portion of one sidewall of their respective trenches.

31. The memory cell of claim 30, wherein the second and third portions of the second control gate extend to a level adjacent the charge carrier trapping sites.

32. The memory cell of claim 28, wherein the memory cell is adjacent a second memory cell sharing the same second control gate but a different first control gate, and sharing one of the charge trapping sites.

* * * * *